(12) United States Patent
Pansier

(10) Patent No.: US 9,190,826 B2
(45) Date of Patent: Nov. 17, 2015

(54) CASCODED SEMICONDUCTOR DEVICES

(71) Applicant: NXP B.V., Eindhoven (NL)

(72) Inventor: Frans Pansier, Nuenen (NL)

(73) Assignee: NXP B.V., Eindhoven (NL)

( * ) Notice: Subject to any disclaimer, the term of this patent is extended or adjusted under 35 U.S.C. 154(b) by 87 days.

(21) Appl. No.: 14/084,441

(22) Filed: Nov. 19, 2013

(65) Prior Publication Data

US 2014/0146428 A1 May 29, 2014

(30) Foreign Application Priority Data

Nov. 23, 2012 (EP) .................................. 12194065

(51) Int. Cl.
| | | |
|---|---|---|
| *H02H 3/00* | (2006.01) | |
| *H02H 1/00* | (2006.01) | |
| *H03K 17/082* | (2006.01) | |
| *H03K 17/10* | (2006.01) | |
| *H03K 17/567* | (2006.01) | |

(52) U.S. Cl.
CPC ......... *H02H 1/0007* (2013.01); *H03K 17/0822* (2013.01); *H03K 17/102* (2013.01); *H03K 17/567* (2013.01)

(58) Field of Classification Search
CPC   H03K 17/0822; H03K 17/102; H03K 17/567

USPC .......................................................... 361/78
See application file for complete search history.

(56) References Cited

U.S. PATENT DOCUMENTS

| | | | |
|---|---|---|---|
| 6,614,281 | B1 | 9/2003 | Baudelot et al. |
| 7,768,758 | B2 * | 8/2010 | Maier et al. .................. 361/93.1 |
| 2004/0027753 | A1 | 2/2004 | Friedrichs et al. |
| 2008/0048806 | A1 | 2/2008 | Maier et al. |
| 2010/0117095 | A1* | 5/2010 | Zhang ............................. 257/76 |
| 2012/0262220 | A1* | 10/2012 | Springett ....................... 327/430 |

FOREIGN PATENT DOCUMENTS

| | | |
|---|---|---|
| EP | 2 662 980 | 11/2013 |
| WO | 03/009455 A2 | 1/2003 |

OTHER PUBLICATIONS

Extended European Search Report for EP Patent Appln. No. 12194065.4 (Apr. 17, 2013).

* cited by examiner

*Primary Examiner* — Stephen W Jackson

(57) ABSTRACT

The invention provides a cascode transistor circuit with a main power transistor and a cascode MOSFET formed as an integrated circuit, packaged to form the cascode transistor circuit. A control and protection circuit is integrated into the integrated circuit together and a storage capacitor provides an energy source to drive the control and protection circuit. A charging circuit is also integrated into the integrated circuit for charging the storage capacitor.

14 Claims, 3 Drawing Sheets

CASCODED SEMICONDUCTOR DEVICES

CROSS-REFERENCE TO RELATED APPLICATIONS

This application claims the priority under 35 U.S.C. §119 of European patent application no. 1294065.4, filed on Nov. 23, 2012, the contents of which are incorporated by reference herein.

This invention relates to cascoded semiconductor devices. It relates in particular to depletion mode transistors, such as gallium nitride (GaN) transistors (e.g. GaN high electron mobility transistors (HEMTs)), or silicon carbide (SiC) field effect transistors.

The invention is of particular interest for GaN power transistors. Basic GaN power semiconductors are depletion mode (normally-on) devices, by virtue of a Schottky gate. This however has the drawback that, depending on circumstances, a large current can flow into the gate, e.g. in the case that large negative currents (i.e. a current from source to drain instead of drain to source) can occur in the application. As this can easily destroy the gate structure, this has to be prevented.

It is possible to do this in the application circuitry, for example by adding an antiparallel diode, but this is disadvantageous, as regular silicon MOSFETs do not need such additional circuitry. Thus, this makes it impossible to interchange an existing MOSFET for a GaN power transistor.

Attempts to introduce additional layers in the layer stack of the power semiconductor to make the device normally-off (and thereby interchangeable with MOSFETs) come together with device performance penalties. Therefore, cascoding high-voltage GaN switches with conventional low-voltage silicon MOSFETs is a viable option to combine the advantages of silicon and GaN power devices.

It is known to provide a GaN power transistor in a cascode circuit with a silicon MOSFET switch. An advantage of a cascoded switch is that existing standard gate drivers can then be used, as the device drive characteristics are mainly defined by the silicon MOSFET. Therefore the device can be used as a direct replacement for silicon MOSFETs or IGBTs.

FIG. 1 shows a well-known approach of a series connection of a normally-on gallium nitride transistor ($M_{GaN}$) and a normally-off silicon MOSFET transistor ($M_{Si}$) power switch in a cascode configuration. This approach is becoming more and more popular for power electronic applications as new GaN and SiC power semiconductors with superior device characteristics compared to Silicon based switches are emerging.

In the standard cascode configuration of FIG. 1, only the power MOSFET $M_{Si}$ is controlled actively by a gate driver, which generates the gate signal $V_{GM}$. The GaN switch $M_{GaN}$ is controlled indirectly via the silicon MOSFET $M_{Si}$ as the MOSFET drain-to-source voltage is connected to equal the GaN source-to-gate voltage.

The use of a MOSFET in the high voltage circuit means that the MOSFET can be exposed to various possible current and voltage conditions which can lead to early failure. There is therefore a need for protection mechanisms.

According to the invention, there is provided a transistor circuit as defined in the claims.

According to one aspect, there is provided a cascode transistor circuit comprising:

a gallium nitride or silicon carbide field effect transistor having its drain connected to a high power line;

a silicon MOSFET with its drain connected to the source of the gallium nitride or silicon carbide FET and its source connected to a low power line and formed as a part of an integrated circuit, wherein the gallium nitride or silicon carbide field effect transistor and the integrated circuits are packaged to form the cascode transistor circuit;

a control circuit integrated into the integrated circuit comprising at least one active component;

a storage capacitor for providing an energy source to drive the active components; and a charging circuit integrated into the integrated circuit for charging the storage capacitor.

The invention provides a cascode circuit in which the MOSFET cascode transistor is part of an integrated circuit which includes an active control circuit, which can thus provide intelligence to the control of the MOSFET. This integrated circuit is a conventional silicon circuit so that significant additional functionality can be implemented without very high effort.

The high and low power lines together define a power supply, i.e. the high power line is the high side power rail and the low power line is the low side power rail of a pair of power rails.

The active components of the control circuit require a power supply, and this is provided with a capacitor and charging circuit. The capacitor can also be integrated into the integrated circuit.

In a first example, the at least one active component comprises a comparator for comparing the MOSFET source voltage with the MOSFET drain voltage and a control switch to turn on the MOSFET when the source voltage exceeds the drain voltage. In this case, the additional intelligence involves the detection of a negative current, and this can be used to switch on the MOSFET to prevent the gate of the power transistor carrying the negative current.

In this case, the silicon die has an additional comparator with the inputs being connected to source (which is at ground) and drain. Whenever negative current starts to flow, the drain goes negative, the output of the comparator becomes high, and this is used to turn on the MOSFET. For this purpose, an OR gate can be used to combine this protection signal with the regular gate drive signal. The protection signal turns the MOSFET on, preventing negative voltage through the MOSFET (whereas the GaN or SiC device can typically handle current flow from source to drain).

Detection of negative current forms one type of protection. Instead or as well, other protection functions can be provided. Examples include protection against over current through the MOSFET, protection against over temperature and/or protection in the event of a detected open loop condition indicative of no connected load.

The various possible protection mechanisms can be latched, and they can also have associated hysteresis.

The circuit can have an output pin coupled to an output of the control circuit.

For example, by adding a small logic block, and an additional pin, the circuit can signal that some protection is active (e.g. signaling that there is negative current flowing). By adding functionality, overvoltage on the FET can be detected and signaled, or using a sense FET, detection of whether a current is flowing or not can be signaled. The voltage on the output pin or the current flowing to the output pin can be used to indicate which protection method or methods are activated.

The gallium nitride or silicon carbide FET can comprise a high electron mobility transistor and the silicon MOSFET transistor can comprise a trench MOS transistor.

The charging circuit can comprises a diode circuit, to provide a charging current to the capacitor when a suitable voltage is present. The charging circuit can comprise a diode between the MOSFET drain and the capacitor and/or a diode between a control input to the cascode transistor circuit and the capacitor.

The supply voltage for the comparator or other components needs to be generated which can in this way be done by simply rectifying the gate drive signal and/or a rectified signal based on the drain voltage. The latter approach artificially increases the drain capacitance that acts to lower the maximum voltage across the MOSFET at switch-off (which is also beneficial for the FET itself).

The invention also provides a circuit arrangement comprising a cascode transistor circuit of the invention and a gate driver circuit having a single gate output line. A power supply can use such a circuit arrangement.

An example of the invention will now be described in detail with reference to the accompanying drawings, in which.

The invention provides a cascode transistor circuit with a main power transistor (formed using first circuit technology) and a cascode MOSFET formed as an integrated circuit (formed using second circuit technology), with the two technologies packaged to form the cascode transistor circuit. A control and protection circuit is integrated into the integrated circuit and a storage capacitor is provided for providing an energy source to drive the control and protection circuit. A charging circuit is also integrated into the integrated circuit for charging the storage capacitor.

The invention relates to cascoded power semiconductor circuits. Emerging new power switches based on GaN and SiC insulated gate devices (such as MOSFETs) often have depletion-mode (normally on) behaviour. Hence, they cannot be used in most power converter applications because they are turned on if the gate is unbiased and hence cause undesired fault conditions in the application. One common solution to realize an inherently safe power switch is to combine a conventional enhancement-mode (normally-off) power switch with these depletion mode (normally-on) power switches in a cascode configuration.

Figure 1:
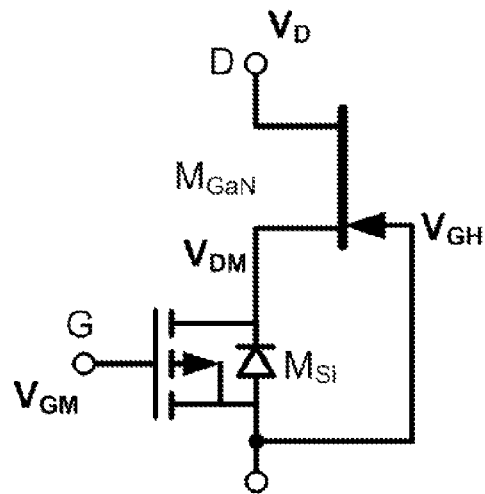
FIG. 1 shows a known cascode circuit.
Figure 2:
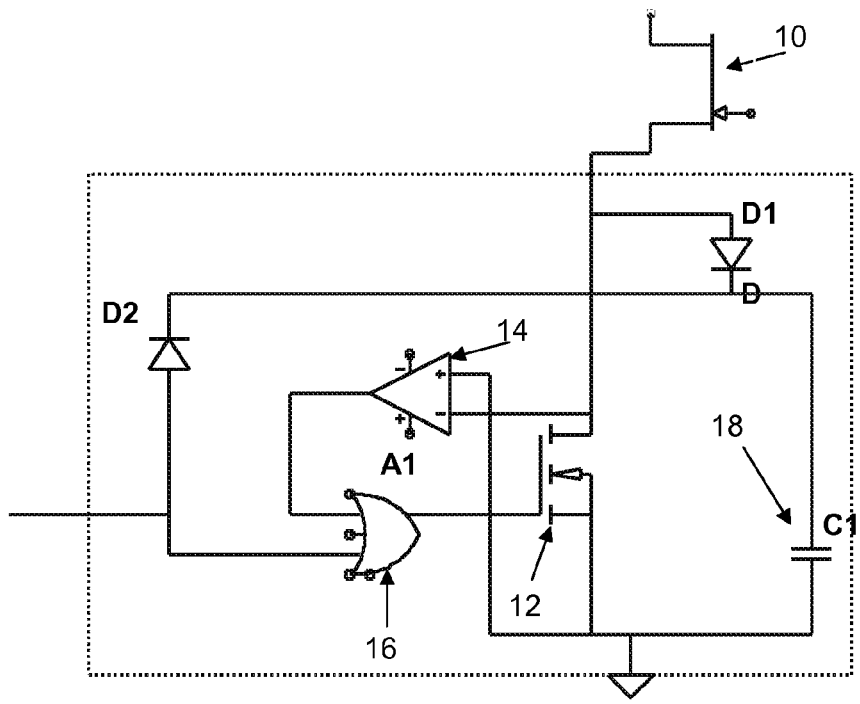
FIG. 2 shows a first example of cascode circuit of the invention.

FIG. 2 shows a first example of circuit of the invention in which integrated internal components are used to provide protection against a negative gate current through the GaN transistor.

The circuit comprises the GaN or SiC power transistor 10 in series with the cascode MOSFET 12.

A comparator 14 compares the MOSFET drain voltage (at the non-inverting input) and the MOSFET source voltage (at the inverting input). The output is provided as one input to as OR gate 16. The other input of the OR gate is the external control input.

The circuit is provided for prevention of negative current through the MOSFET.

Whenever a current starts to flow from ground to the drain of the power transistor, which is caused by the application, and has to be allowed for, the drain voltage of the MOSFET 12 will become negative. The drain voltage is compared to the source voltage (which is ground) by the comparator 14. When the drain becomes negative, the output of the comparator becomes positive, and though the OR gate 16 the gate of the FET is activated, turning the FET on.

As the current flow continues to keep the drain voltage negative, no hysteresis is needed. The voltage drop across the MOSFET will be as small as possible, so it will also enhance efficiency. As soon as the negative current stops flowing, the output of the comparator turns low, thereby switching off the FET if there is no external gate drive signal. The circuit is thus self-protecting.

To integrate the protection circuitry (in this case the comparator and OR gate) into the same IC as the MOSFET a power supply is needed for these components.

The invention provides an on-chip capacitor 18 which is charged to provide the energy supply.

A first way to charge the capacitor is to make use of the always present leakage current of the power transistor 10. A safeguarding must be present to prevent the voltage across the MOSFET becoming too high, either with an additional Zener diode, or by allowing the FET to avalanche at this very low current.

When the drain-source voltage exceeds the breakdown voltage, the body diode of a regular vertical MOSFET will automatically start avalanching. In some cases, that avalanching can be destructive, so special measures are often taken to prevent avalanching. By avoiding these protective measures, the drain-source voltage can be automatically clamped by the breakdown voltage of the FET itself.

In this case, the capacitance 18 for the supply voltage is charged via a diode D1 between the power transistor source and the positive terminal of the capacitor. The negative terminal of the capacitor is connected to the MOSFET source (which is ground).

Alternatively, the drive voltage for the gate, as supplied by the driver IC, can be used as the charging mechanism. This can be achieved by rectifying this gate voltage via diode D2 which is between the control input to the cascode circuit and the capacitor terminal. A combination of both is possible as shown in FIG. 2.

A benefit of using the diode D1 is that it enhances the effective value of the source drain capacitance Cds of the MOSFET. At switch off, a capacitive voltage divider consisting of Cds of the power transistor and Cds of the MOSFET is active. This causes the voltage across the MOSFET to become quite high. For example, supposing Cds of the MOSFET is 500 pF and Cds of the power transistor is 50 pF, then if after switch-off the drain of the total cascode rises to 600V, 60V will appear on the drain of the FET.

To prevent problems with this high voltage one of the options is to artificially increase the drain source capacitance Cds of the MOSFET. However this will increase switch-on losses. The use of a diode to implement the effective increase in Cds means that the energy is used to the benefit of powering the additional circuitry.

FIG. 2 provides protection against negative currents through the MOSFET. The additional circuitry added to the MOSFET IC can be used for other or additional features, for example other protection mechanisms.

Figure 3:
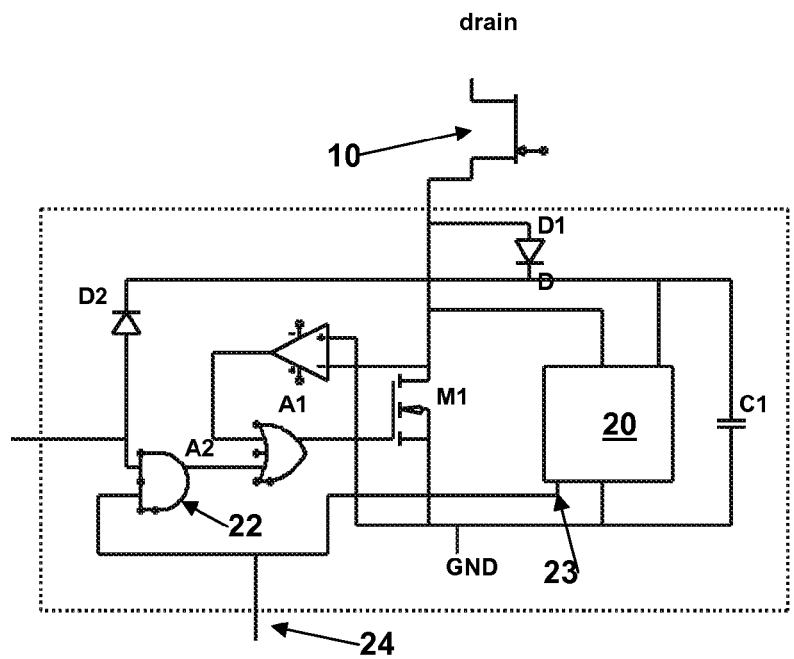
FIG. 3 shows a second example of cascode circuit of the invention.

FIG. 3 shows a generic protection block 20. The control input to the circuit is provided to an AND gate 22 which is used to enable the gate high command to be disabled.

The protection block 20 can have a temperature sensor inside, and/or it can detect overvoltage across the MOSFET, and/or (in the case of a sense FET) can detect overcurrent, and/or can be used to detect lack of current if a current is intended always to flow. This latter option provides detection of an open circuit condition.

In FIG. 3, when the output 23 of the protection block 20 is high, the gate can be activated by the control input signal. Whenever the output is low the AND gate 22 keeps the gate low as well. This can act as an additional safety feature, so that that MOSFET can only be switched on when the drive voltage is sufficiently high.

The supply voltage across the capacitor C1 has to be at a certain minimum in order for a high signal to be provided to the AND gate 22 and therefore the MOSFET to be switched on. This prevents the voltage at the gate being too low, and also prevents false behavior. Either the system is fully running, or the MOSFET will be kept off. This approach requires sensing of the supply voltage in the protection block, so a start/stop feature can be built in, as is known from regular control ICs.

An additional feature can be to have the output of the protection block available at a separate pin 24. This results in a 4 pin package. This pin 24 can provide information about the type of protection that is currently being provided.

In embodiments, it can be beneficial to increase the capacitance by using an external capacitance, improving hold-up time, and other performance characteristics. Adding external capacitance also leads to the possibility to reduce on chip-capacitance, saving chip area and thus cost. If an additional pin is available, there is also the possibility to connect to an external supply, for example an auxiliary (standby) supply. In this case, the capacitance C1 can connect to an external pin of the package. In this case, a five pin package may be used.

Figure 4:
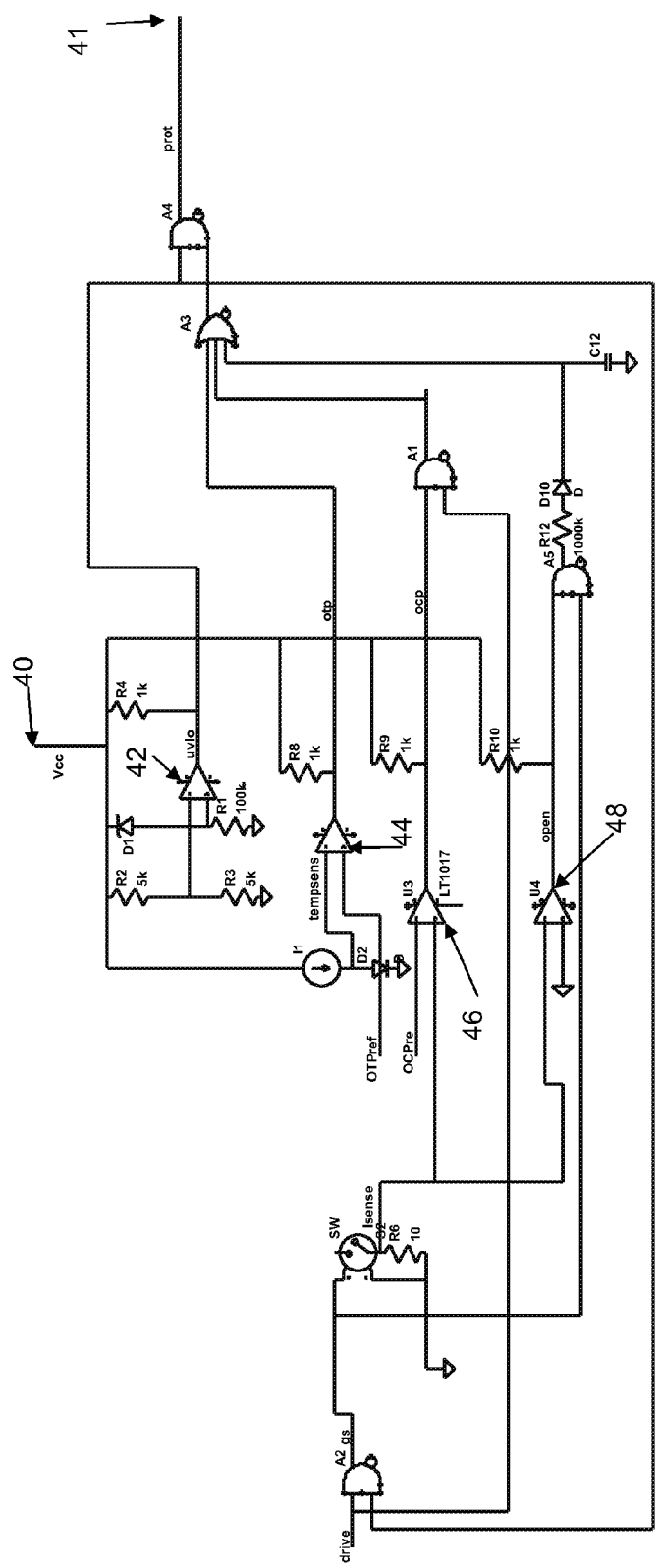
FIG. 4 shows a third example of cascode circuit of the invention.

An example of an implementation of the protection block 20 is shown in FIG. 4.

The Vcc node 40 is the supply to the circuit as described above, namely the voltage on the capacitor C1 in FIG. 3.

The output of the circuit is provided to the protection pin 41.

The comparator 42 forms the main component of an under voltage lockout ("UVLO") protection block. Only when the output is high enough is the protection signaling enabled through an AND gate A4. This UVLO signal is also connected to an AND gate A2 at the gate input to the circuit, thereby only transferring the external drive signal to the gate when Vcc is high enough. The power for driving the gate can of course nevertheless be supplied by the external gate drive signal.

The comparator 44 forms the main component of an over temperature protection ("OTP") unit, for preventing operation when there is high temperature stress. Whenever this protection is activated the protection pin is enabled. In the application the designer of the power supply (or motor drive circuit, etc.) can decide either to reduce power or to completely shut down. Alternatively this output can be inverted and fed to the input AND gate A2 as an additional protection, shutting down immediately whenever over temperature is activated.

The comparator 46 forms the main component of an over current protection ("OCP") unit.

Just after switching off, the current through the switch can continue to increase for a small amount of time, due to the high drain-source capacitance of the lower MOSFET. Thus, in this way the OCP can be triggered after the drive pulse has already become low. This is a spurious activation of the OCP protection. The AND gate A1 ensures that an OCP signal can only trigger protection if the input gate drive signal is also high.

Again, the detection signal can again be fed back (after inversion if necessary) to the input AND gate A2, acting as a cycle-by cycle protection.

The comparator 48 forms the main component of an open circuit detection unit. As long as there is no voltage across a sensing resistor R6, the output of comparator 48 ("open") is high. However, this signal is only valid whenever a current is supposed to flow, so the output signal is combined with the (internal) gate drive (which is the output of the AND gate A2). This is the function of the AND gate A5.

To prevent spurious activation it is advantageous to implement a delay, which is shown as an RC time constant using resistor R12 and capacitor C12. The output voltage of this filter is fed to the OR gate A3, so that the open circuit protection is only activated when the output voltage has reached the threshold voltage of the OR gate A3. This voltage has of course to be reset by appropriate means (not drawn), e.g. whenever there is a current again above a predetermined threshold voltage.

The OR gate A3 combines all the protection signals (OTP, OCP and open) to derive a combined protection signal, which is combined with the under voltage lockout signal UVLO by the AND gate A4. Thus, for the output signal "prot" to be generated, the under voltage lockout signal has to be high (to indicate that the circuit function is reliable) and one or more of the protection detection signals needs to be high, to indicate that protection is required.

The circuit of FIG. 4 thus provides protection against over current through the MOSFET, protection against over temperature and protection in the event of a detected open loop condition indicative of no connected load connected. The other components in FIG. 3 also provide protection against reverse currents through the MOSFET, so that the overall circuit provides four different types of protection mechanism.

The circuit can implement any combination of these four protection schemes, and indeed other intelligence can be built into the circuit.

To implement all this on a high voltage MOSFET with its associated large feature size, might lead to too high area. However, in the case of a GaN cascode circuit, the breakdown voltage can be even as low as 10V, enabling smaller feature size.

When this protection signal on pin 41 is only logical 1 or 0, it is only possible to detect whether or not a protection is activated, without being able to identify which one. To add a detection mechanism to enable a signal to identify which protection is activated, a digital circuit can be used and the output pin 41 can be equipped with a communication protocol, such as I2C. However, implementing a digital part might not be advantageous.

Figure 5:
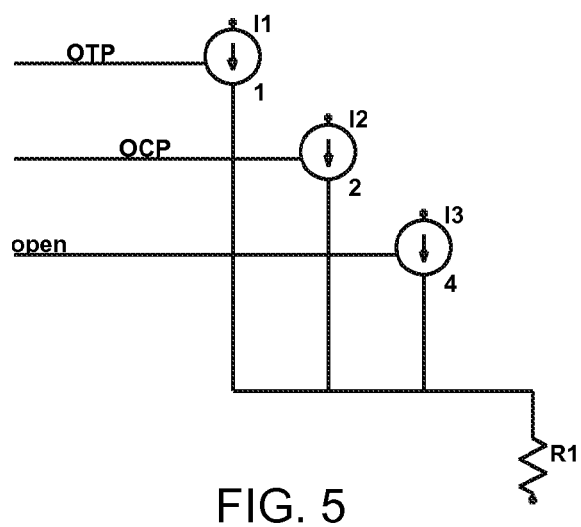
FIG. 5 shows an analogue circuit for detecting if protection is activated.

An alternative analogue embodiment is shown in FIG. 5.

The three protection signals OTP, OCP and open are each used to activate a different current source I1, I2, I3. The current source outputs combine to drive a resistor R1. The three current sources can be implemented using a scaled current mirror circuit. The total current indicates which single or combination of protection mechanisms is activated. The resistor R1 can be external in which case the output pin delivers a current, or else the resistor R1 can be internal, the pin output is then a voltage.

The current level can be very small. When protection is enabled, the gate is not driven, so that the power that can be delivered by the external gate driver can be enough to keep the total detection/protection circuit alive.

Some detections can be latched, and/or hysteresis can be implemented.

The invention can be applied in all situations in which a cascode circuit is used, involving a low voltage Si-MOSFET connected with its source to ground (or alternatively to a sensing resistor), together with a normally on transistor, such as a GaN HEMT with Schottky gate.

This combination can be used in all types of power supplies and or related circuits like motor drives and (PV) inverters, in which either reverse conduction can occur and/or additional protection mechanisms have benefits for the total application, being either ease of use or reliability enhancement.

The circuit package can comprise a three terminal package (MOSFET source, gate control input and GaN/SiC drain) or a four terminal package with the additional signaling pin, or a five terminal package which can for example have a pin for connection to an external capacitor as outlined above.

The MOSFET and protection circuit shown can instead be integrated into the overall driver IC.

The invention can be used in all power conversion applications in which normally-off switches are required, and enables the use of normally-on GaN or SiC devices in such applications. By way of example, the invention can be used in:

power factor correction (PFC) circuits, for example as used in grid connected power supplies;

phase legs of high voltage inverter circuits, for example motor drives or photovoltaic converters;

a switched mode (e.g. soft switching) power converter circuits.

Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measured cannot be used to advantage. Any reference signs in the claims should not be construed as limiting the scope.

The invention claimed is:

1. A cascode transistor circuit comprising:
   a gallium nitride or silicon carbide field effect transistor having its drain connected to a high power line
   a silicon MOSFET with its drain connected to the source of the gallium nitride or silicon carbide FET and its source connected to a low power line and formed as a part of an integrated circuit, wherein the gallium nitride or silicon carbide field effect transistor and the integrated circuit are packaged to form the cascode transistor circuit;
   a control and protection circuit integrated into the integrated circuit comprising at least one active component; wherein the at east one active component comprises a comparator for comparing the MOSFET source voltage with the MOSFET drain voltage and a control switch to turn on the MOSFET when the source voltage exceeds the drain voltage;
   a storage capacitor for providing an energy source to drive the active components; and
   a charging circuit integrated into the integrated circuit for charging the storage capacitor.

2. A circuit as claimed in claim 1, wherein the capacitor is integrated into the integrated circuit.

3. A circuit as claimed in claim 1, wherein the integrated circuit comprises at least three terminals; the MOSFET source, a control input and the MOSFET drain.

4. A circuit as claimed in claim 1, wherein the control and protection circuit provides protection against over current through the MOSFET.

5. A circuit as claimed in claim 1, wherein the control and protection circuit provides protection against over temperature.

6. A circuit as claimed in claim 1, wherein the control and protection circuit provides protection in the event of a detected open loop condition indicative of no connected load connected.

7. A circuit as claimed in claim 1, having an output pin coupled to an output of the control and protection circuit.

8. A circuit as claimed in claim 7, wherein the voltage on the output pin or the current flowing to the output pin indicates which protection method or methods are activated.

9. A circuit as claimed in claim 1, wherein the gallium nitride or silicon carbide FET comprises a high electron mobility transistor and/or wherein the silicon MOSFET comprises a trench MOS transistor.

10. A circuit as claimed in claim 1, wherein the charging circuit comprises a diode circuit.

11. A circuit as claimed in claim 10, wherein the charging circuit comprises a diode between the MOSFET drain and the capacitor.

12. A circuit as claimed in claim 10, wherein the charging circuit comprises a diode between a control input to the cascode transistor circuit and the capacitor.

13. A circuit arrangement comprising:
   a cascode transistor circuit as claimed in claim 1; and
   a gate driver circuit having a single gate output line.

14. A device comprising a circuit arrangement as claimed in claim 13, wherein the device comprises:
   a power supply; or
   a power factor correction circuit; or
   an inverter circuit; or
   a switched mode power converter circuit.

* * * * *